Figure 1:
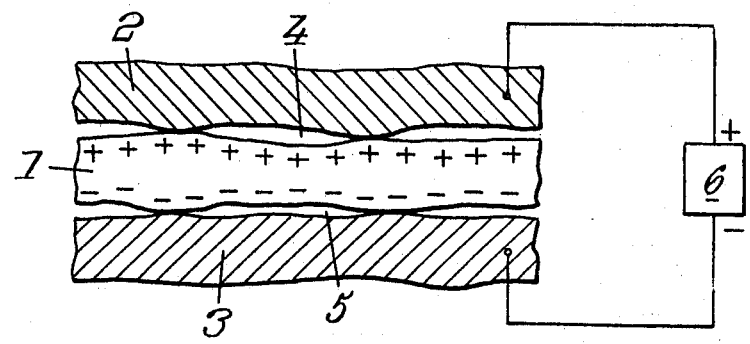

United States Patent [19]

Dreyfus et al.

[11] 4,093,884

[45] June 6, 1978

[54] THIN STRUCTURES HAVING A PIEZOELECTRIC EFFECT, DEVICES EQUIPPED WITH SUCH STRUCTURES AND IN THEIR METHODS OF MANUFACTURE

[75] Inventors: Gerard Dreyfus, Villebon sur Yvette; Jacques Lewiner, Saint Cloud, both of France

[73] Assignee: Agence Nationale de Valorisation de la Recherche (ANVAR), Neuilly, Seine, France

[21] Appl. No.: 798,355

[22] Filed: May 19, 1977

Related U.S. Application Data

[63] Continuation of Ser. No. 394,553, Sep. 6, 1973, abandoned.

[30] Foreign Application Priority Data

Sep. 8, 1972 France .................................. 72.31903

[51] Int. Cl.² .......................................... H01L 41/10
[52] U.S. Cl. .................................... 310/328; 310/800
[58] Field of Search .............. 310/357, 800, 334, 328; 361/233; 307/88 ET; 179/111 E; 29/25.35

[56] References Cited

U.S. PATENT DOCUMENTS

| | | | |
|---|---|---|---|
| 2,740,184 | 4/1956 | Thomas ................................ | 361/233 |
| 3,276,031 | 9/1966 | Gaynor ................................ | 307/88 ET |
| 3,365,593 | 1/1968 | Roof et al. ......................... | 310/800 X |
| 3,792,204 | 2/1974 | Murayama et al. ............. | 310/800 X |
| 3,793,715 | 2/1974 | Murayama et al. ............. | 307/88 ET |
| 3,832,580 | 8/1974 | Yamamuro et al. ............. | 310/800 X |
| 3,894,198 | 7/1975 | Murayama et al. ............. | 310/800 X |

*Primary Examiner*—Mark O. Budd
*Attorney, Agent, or Firm*—Larson, Taylor and Hinds

[57] ABSTRACT

A leaf of suitable dielectrical material bears, trapped on one at least of its two surfaces, equal or substantially equal amounts of positive and negative electrostatic charges, these charges being preferably injected into the leaf by successive ionization in reverse directions of gaseous layers against said surface. The device is valuable in piezoelectric or pyroelectric devices such as ultrasonic transducers, pressure or vibration detectors, microphones, heat or infrared radiation detectors.

9 Claims, 2 Drawing Figures

THIN STRUCTURES HAVING A PIEZOELECTRIC EFFECT, DEVICES EQUIPPED WITH SUCH STRUCTURES AND IN THEIR METHODS OF MANUFACTURE

This is a continuation, of application Ser. No. 394,553 Sept. 6, 1973, now abandoned.

The invention relates to thin structures of the type of leaves, plates, or pieces of leaves or plates such as pastilles, or ribbons—which structures will be denoted by the term "leaves" in the following description — having a piezoelectric effect, that is to say capable of converting electrical voltages applied between their two surfaces into mechanical vibrations or conversely, which effect can be accompanied by a pyroelectric effect (conversion of electrical voltages into heat or conversely).

It relates also to methods for the manufacture of such leaves as well as to devices equipped with these leaves, such as ultrasonic transducers, sensors of pressure or of vibrations (for example microphones, telephonic receivers or emitters, etc.), detectors of heat or of infrared radiation, etc.

It is a particular object of the invention to render leaves of the type concerned such that they respond to the various exigencies of practice better than hitherto, for example as regards their electrical neutrality with respect to the exterior, their long life span, the great width of the frequency band exploited if the voltage used is an alternating voltage, and the simplicity with which they can be applied to non-planar surfaces.

Leaves of the type concerned are characterised in that they are constituted of a dielectric material and in that they carry, trapped on one at least of their surfaces or in the neighbourhood of the latter, electrostatic charges of opposite signs in such amounts that the overall electrical field produced by these different charges close to said surface is nil or substantially nil.

Devices equipped with such leaves comprise two electrically conductive elements arranged on both sides of the leaf, directly or not, and means for applying an electrical voltage between these two elements and/or to collect the electrical voltage created between the latter.

A preferred method of manufacture of said leaves is characterised by the following sequence of operations: the leaf is inserted between two conductive cores with the interposition at least locally of layers of gas sufficiently thin for the ionising voltage $V_1$ of each of these layers to be distinctly less than the break-down voltage $V_2$ of the leaf, these two cores are connected to the terminals of a direct current voltage source whose value V is comprised between $V_1$ and $V_2$, and finally the two cores concerned are connected to the terminals of a direct current voltage source of reverse polarity to the preceding one until the equivalent voltage $V_0$ of the leaf (that is to say the voltage to be applied to the cores for the electrical field created by the charged leaf and by this voltage to be nil in the layers of gas enclosing this leaf) becomes nil or in the neighbourhood of zero, the absolute value of the reverse voltage being different from zero, less than $V_2 + V_0$ and greater than $V_1 - V_0$ if the latter quantity is positive.

The invention comprises, apart from these main features, certain other features which will be more explicitly considered below.

In the following there will be described preferred embodiments of the invention with reference to the accompanying drawing, intended of course to be non-limiting and purely illustrative.

Figure 2:
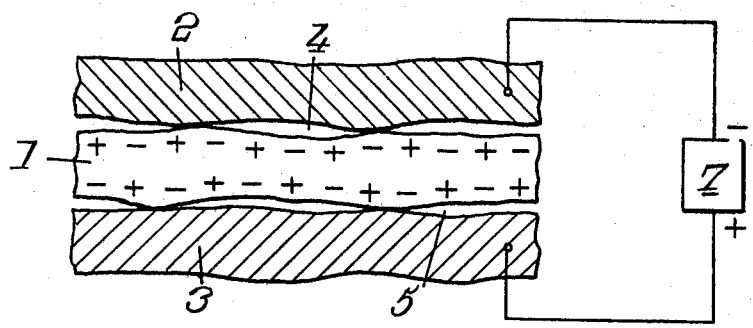

FIGS. 1 and 2 of this drawing, illustrate diagrammatically two successive phases of a method of manufacture of a dielectric leaf with piezoelectric properties according to the invention.

Before going into details, it will be recalled that it has already been proposed previously to charge a thin dielectric leaf between two electrically conductive plates forming therewith a capacitor: each charged surface of this leaf (that is to say, one or both of its two surfaces) then only comprises electrostatic charges of a single sign. Such a charged leaf, called an "electret", can then be used in a transducer without it being necessary to have recourse to external polarisation.

It has even been proposed in French Patent No. 70 41766, filed by applicants on Nov. 20, 1970, to apply to the cores of a capacitor having such an electret as dielectric and separated from this dielectric by thin layers of gas, an external direct voltage whose polarity is the reverse of that of the direct voltage which has served to polarise the electret, in order to reinforce the electrical field in the neighbourhood of the electret.

However care was then taken that this second direct voltage is less than the ionising potential of the gaseous layers to avoid the injection into the charged leaves of charges of opposite sign to those already collected, lest the electrification of the dielectric be eliminated.

In any case, in each instance, whether auxiliary external polarisation is provided or not, the transducer equipped with such an electret functioned in an "electrostatic" manner, that is to say bringing into play the continuous electrical field existing between the electret and the metallic cores: such a manner only brings into play the mechanical vibrations of the cores, vibrations requiring the existence of said field in conjunction with alternating electrical energization of these cores, the charged dielectric leaf being the seat only of mechanical vibrations transmitted to it by said cores, but of no vibration proper of piezoelectric origin.

Now applicants have discovered that, in an entirely surprising manner, if there is injected into each electrostatically charged surface of an electret electrostatic charges having opposite sign to those already collected on this surface, and this until the overall electrical field due to the totality of collected charges is nil or almost nil in the neighbourhood of said surface, there is obtained a leaf which, overall, is electrically neutral but which, contrary to uncharged leaves of the same nature, is the site of a "piezoelectric" effect proper independently of any polarisation. In other words the dielectric leaf, when it is energized by the application of an alternating electrical voltage to the cores which enclose it, is the site of mechanical vibrations "proper" since the continuous electrical field between these cores and this leaf is then nil or substantially nil, which vibrations are transmitted to said cores.

To obtain such dielectric leaves with balanced distribution of electrostatic charges of opposite signs on one at least of their two surfaces, procedure is as follows.

Recourse is had to a thin leaf whose thickness is comprised between 3 and 500 microns, preferably of the order of 10 to 30 microns.

This leaf is constituted of any desirable dielectric material such as especially polypropylene, polystyrene, a polycarbonate, a polyimide, a mica or one of the plastics materials known under the trade names Mylar, Teflon, Kapton, Bakelite . . . .

According to a preferred method a piece 1 of such a leaf is inserted between two conductive electrodes 2 and 3 with the interposition of thin layers of gas 4 and 5 which can be constituted by the air spaces present between the surfaces in contact, due to the inevitable existence of irregularities of their surfaces.

In the following there will be denoted by equivalent voltage $V_O$ of the electrically charged leaf 1, the voltage which must be applied between the electrodes 2 and 3 for the overall electrical field created by this leaf and by this voltage in the layers of gas 4 and 5, to be nil.

These layers of gas 4 and 5 must be such that their ionising potential $V_1$ is less than the breakdown potential $V_2$ of the leaf 1: in order that this condition be respected, the nature, the presence and/or the thickness of the layers of gas may be modified, the latter parameter being capable of modification by means of perforated separating shims.

The distance between one of the electrodes and the facing surface of the leaf can also be modified without substantially modifying and thickness, by the interposition of a layer of glass or of another material permeable to electrical current but not to the gases.

The electrodes can be flat, as illustrated, or on the contrary terminated at a point or at a knife-edge on the side of the leaf 1, in which case a displacement between the electrodes and the leaf could be envisaged parallel to the surface of the leaf.

These electrodes are connected to two terminals of a direct current source 6 (FIG. 1).

The value V of this voltage is adjusted so that it is comprised between $V_1$ and $V_2$.

After a sufficient time equilibrium is reached, that is to say the equivalent voltage $V_0$ of the electret obtained approaches $V - V_1$, the distribution of the electrostatic charges of the leaf then being of the type shown diagrammatically in FIG. 1 where the upper surface bears a plurality of charges all positive and the lower surface, a plurality of charges all negative.

The connection between the electrodes and the source 6 is then eliminated and these electrodes are connected to the two terminals of a source 7 (FIG. 2) of continuous voltage whose polarity is the reverse of the preceding one.

The absolute voltage V' of this reverse voltage must remain less than $V_2 + V_0$ to avoid breaking the leaf 1. It must also be different from zero and greater than $V_1 - V_0$ if this amount is positive, to ionise the layers of gas 4 and 5 in the reverse sense to the preceding one and to inject into the surfaces concerned of the leaf 1 electrostatic charges having the opposite sign to that of the charges which are already collected there.

This is the contrary to that which was done according to the prior art recalled above, according to which it was necessary to take care that the absolute value of the second voltage remained less than the potential $V_1 - V_0$ (which quantity was then always positive) to avoid ionisation of the gaseous layers 4 and 5.

It must be noted that if the equivalent voltage $V_0$ of the charged electret at the end of the second stage of charging has a value, neighbouring $V - V_1$, greater than $V_1$ (that is to say if $V_1 - V_0$ is negative), this value will automatically decrease in time to the vicinity of $V_1$ when the voltage V is eliminated, considering that the ionising potential of the gaseous layers has the same value $V_1$ for the two directions of passage through these layers.

Said absolute value of the voltage V' can initially approximate $V_1 - V_0$ if this quantity is positive or be slightly positive in the opposite case. It is then gradually increased to a value in the vicinity of $V_1$ until the equivalent voltage $V_0$ reaches a substantially nil value.

At the same time, by methods known in themselves bringing into play especially optical or ultrasonic measures, the value of the overall electrical field due to the single equivalent voltage of the electret is observed, and the second charge is stopped when this field becomes nil or substantially nil.

One then has a leaf 1 which comprises, trapped on its two surfaces, positive and negative electrostatic charges in substantially equal amounts as shown diagrammatically in FIG. 2.

To use such a leaf, it is placed as a sandwich between two conductive elements with or without the interposition of gas, one at least of these two elements being constitutable by metallisation of one of the surfaces of the leaf, then these two elements are connected to a source of electrical voltage and/or to a utilising receiver system.

The leaf concerned has the advantage of being electrically neutral, which can be valuable for avoiding disturbances in certain media or equipment.

Its thinness and its flexibility enable application to non-planar surfaces of objects capable of constituting one of the above conductive elements.

Moreover, by reason especially of the electrical equilibrium of the charges which are collected there, its life duration is great.

In addition, like electrets of similar composition, it lends itself to the simultaneous treatment of frequencies comprised within a wide band in the case where the voltage emitted or received by means of the device equipped with such a leaf is a high frequency alternating voltage (generally comprised between 20 kHz and 200 MHz).

Purely by way of illustration and in no way limiting of the invention, there are given below some specifications relating to one embodiment of the latter which has given every satisfaction.

The leaf 1 is a pastille of polypropylene of 10 microns thickness whose surface is of the order of $cm^2$. It is separated from the electrodes, of flat shape, by layers of air of 2 to 3 microns thickness at atmospheric pressure.

Under these conditions, the voltage thresholds $V_1$ and $V_2$ are respectively of the order of 900 and 4,000 volts, the voltage V is of the order of 2,500 volts and it is applied for about 5 minutes and the voltage V', applied for about 2 minutes, is initially of the order of some volts and is gradually increased up to 900 volts, which corresponds to a maximum value of the voltage $V_0$ (reached at the moment of reversal of polarity of the external polarising source) of the order of 1600 volts, and to a final nil value of this voltage $V_0$.

The surface density of the electrical charges injected into the two surfaces of the pastille 1 is then of the order of $3.10^{-7}$ Coulomb/$cm^2$ for each type of charge.

In a more general way, the density of the electrical charges on each surface must be greater than $5.10^{-10}$ Coulomb/$cm^2$ for each type of charge.

Of course, charges of both signs could be injected into the leaf other than by ionisation of the gaseous layers positioned against the latter: in particular said injection can be effected by means of electron guns and positive ion guns.

In certain cases it may be advantageous to exploit the pyroelectric effect of which the charged dielectric leaves according to the invention are the site.

For certain applications it can also be advantageous not to render the overall electrical field due to the doubly charged dielectric leaf entirely nil: under such conditions a transducer equipped with said leaf is simultaneously the site of the two phenomena respectively qualified above as "electrostatic" (vibrations proper of the conductive electrodes) and "piezoelectric" (vibrations proper of the dielectric leaf) and it is easy to modify the dephasing between the two waves corresponding respectively to these two phenomena by modifying the conditions of transmission of the waves from one at least of the leaf electrodes, for example by causing the temperature of a special layer interposed between this electrode and the leaf to vary: such a principle can be applied to temperature sensing.

As is self-evident, and as emerges already from the foregoing, the invention is in no way limited to those of its types of application and embodiments which have been more especially envisaged; it encompasses, on the contrary, all modifications, especially those where only one of the two surfaces of the dielectric leaf would be charged with balanced quantities of positive and negative electrostatic charges.

We claim:

1. A thin structure comprising a dielectric leaf having trapped on or proximate at least one of the surfaces of said leaf electrostatic charges of opposite signs in balanced amounts and distribution such that the overall electrical field produced by said charges close to said surface is at least substantially nil, said leaf exhibits substantially no electrostatic effect, and said leaf exhibits a piezoelectric effect as a result of said charges which is independent of any polarization of said leaf.

2. Thin structure according to claim 1, whrein the thickness of the leaf is between 3 and 500 microns.

3. Thin structure according to claim 2, wherein the thickness of the leaf is of the order of 10 to 30 microns.

4. Thin structure according to claim 1, wherein the density of the electrostatic charges collected on one at least of its surfaces is greater than $5.10^{-10}$ Coulomb/cm$^2$ for each type of charge.

5. Thin structure according to claim 4, constituted by a leaf of polypropylene of 10 microns thickness, wherein the density of the electrostatic charges on each of its surfaces is of the order of $3.10^{-7}$ Coulomb/cm$^2$ for each type of charge.

6. Method of manufacturing a thin structure according to claim 1, comprising the following sequence of operations: inserting a dielectric leaf between two conductive cores with the at least local interposition of gaseous layers sufficiently thin for the ionising voltage $V_1$ of each of said layers to be distinctly less than the breakdown voltage $V_2$ of the leaf, connecting these two cores to the terminals of a continuous voltage source whose value is comprised between $V_1$ and $V_2$ and finally connecting the two cores concerned to the terminals of a continuous voltage source of reverse polarity to the preceding one until the equivalent voltage $V_0$ of the leaf (that is to say the voltage to be applied to the cores for the electrical field created by the charged leaf and by this voltage to be nil in the gaseous layers enclosing this leaf) to become nil or close to zero, the absolute value of said reverse voltage being different from zero, less than $V_2 + V_0$, and greater than $V_1 - V_0$ if this latter amount is positive.

7. Apparatus comprising two spaced, electrically conductive elements and a thin structure disposed therebetween, said thin structure comprising a dielectric leaf having trapped on or proximate at least one of the surfaces of said leaf electrostatic charges of opposite signs in balanced amounts and distribution such that the overall electrical field produced by said charges close to said surface is at least substantially nil, said leaf exhibits substantially no electrostatic effect, and said leaf exhibits a piezoelectric effect as a result of said charges which is independent of any polarization of said leaf, said apparatus further comprising means for applying an electrical voltage between said conductive elements and/or for sensing an electrical voltage produced between said conductive elements as a result of vibration of said thin structure.

8. The apparatus of claim 1 wherein at least one of said conductive elements is formed by metallization of at least one of the surfaces of said leaf.

9. The apparatus of claim 1 wherein a gas is disposed between said thin structure and at least one of said conductive elements.

* * * * *